(12) United States Patent
Hwang

(10) Patent No.: US 8,836,386 B1
(45) Date of Patent: Sep. 16, 2014

(54) SEMICONDUCTOR DEVICE WITH POWER-UP SCHEME

(71) Applicant: SK hynix Inc., Gyeonggi-do (KR)

(72) Inventor: Jeong-Tae Hwang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/935,989

(22) Filed: Jul. 5, 2013

(30) Foreign Application Priority Data

Apr. 16, 2013 (KR) .......................... 10-2013-0041384

(51) Int. Cl.
*H03L 7/00* (2006.01)
*H03K 17/22* (2006.01)
(52) U.S. Cl.
CPC ...................................... *H03K 17/22* (2013.01)
USPC ............................ 327/143; 327/142; 327/198
(58) Field of Classification Search
USPC .......................................... 327/142, 143, 198
See application file for complete search history.

(56) References Cited

U.S. PATENT DOCUMENTS

| 5,319,601 | A | * | 6/1994 | Kawata et al. | ................. 365/226 |
| 6,459,652 | B1 | * | 10/2002 | Lee et al. | ................. 365/233.14 |
| 7,696,796 | B2 | * | 4/2010 | Kwon | ........................... 327/143 |
| 7,965,573 | B2 | * | 6/2011 | Byeon | ........................... 365/226 |
| 2003/0038666 | A1 | * | 2/2003 | Wada | .............................. 327/530 |
| 2005/0189970 | A1 | * | 9/2005 | Nakatake et al. | ............. 327/143 |
| 2010/0127766 | A1 | * | 5/2010 | Matano | ........................ 327/543 |
| 2011/0095814 | A1 | * | 4/2011 | Kim et al. | .................... 327/538 |

FOREIGN PATENT DOCUMENTS

| KR | 1020010065144 | 7/2001 |
| KR | 1020030089878 | 11/2003 |

* cited by examiner

*Primary Examiner* — Brandon S Cole
(74) *Attorney, Agent, or Firm* — IP & T Group LLP

(57) ABSTRACT

A semiconductor device includes a voltage detection circuit suitable for detecting an external power supply voltage and for sequentially activating first and second power-up signals in a power-up period of the external power supply voltage, and a control circuit suitable for activating at least one first control signal for controlling an internal voltage to be generated based on the first power-up signal, and for activating at least one second control signal for controlling an operation of an internal circuit using the internal voltage when a predetermined time lapses after the first control signal is activated, based on the second power-up signal.

13 Claims, 3 Drawing Sheets

SEMICONDUCTOR DEVICE WITH POWER-UP SCHEME

CROSS-REFERENCE TO RELATED APPLICATIONS

The present application claims priority of Korean Patent Application No. 10-2013-0041384, filed on Apr. 16, 2013, which is incorporated herein by reference in its entirety.

BACKGROUND

1. Field

Exemplary embodiments of the present invention relate to a semiconductor design technology, and more particularly, to a semiconductor device with a power-up scheme.

2. Description of the Related Art

In general, a semiconductor device using an external power supply voltage includes a power-up signal generation circuit to ensure a stable operation of an internal circuit. The power-up signal generation circuit activates a power-up signal when an external power supply voltage supplied from an exterior has reached a target voltage level for the stable operation of the internal circuit.

The power-up signal is used as a reset signal for initializing the internal circuit, an enable signal for controlling the operation of the internal circuit, and the like. For example, the power-up signal may be used to enable an internal voltage generation circuit, an e-fuse array, and the like.

Meanwhile, in the semiconductor device, when the internal circuit, enabled in response to the power-up signal, operates using the internal voltage as a source voltage, it may be difficult to ensure the operation stability of the internal circuit. That is, since the internal voltage is also generated in response to the power-up signal, when the internal circuit uses the internal voltage before the internal voltage is stabilized (i.e., reaches a target voltage level), the operation of the internal circuit may become unstable. For example, a fuse read operation is performed in an e-fuse array using the internal voltage through a power-up sequence of the semiconductor device. Since the internal voltage generation circuit for generating the internal voltage is also enabled in the power-up sequence (i.e., based on the power-up signal), the internal voltage may be generated in an unstable state, and thus the programmed data of the e-fuse array may not be normally loaded in the fuse read operation.

SUMMARY

Exemplary embodiments of the present invention are directed to a semiconductor device in which an internal circuit is enabled when an internal voltage is stabilized.

In accordance with an embodiment of the present invention, a semiconductor device may include a voltage detection circuit suitable for detecting an external power supply voltage and for sequentially activating first and second power-up signals in a power-up period of the external power supply voltage, and a control circuit suitable for activating at least one first control signal for controlling an internal voltage to be generated based on the first power-up signal and for activating at least one second control signal for controlling an operation of an internal circuit using the internal voltage when a predetermined time lapses after the first control signal is activated, based on the second power-up signal.

In accordance with another embodiment of the present invention, a semiconductor device may include a voltage detection circuit suitable for activating a pre-power-up signal when an external power supply voltage is at a first target voltage level in a power-up period of the external power supply voltage, for activating a power-up signal when the external power supply voltage is at a second target voltage level that is higher than the first target voltage level in the power-up period of the external power supply voltage, and for activating a post-power-up signal when the external power supply voltage is at a third target voltage level that is higher than the second target voltage level in the power-up period of the external power supply voltage, a first control unit suitable for generating a first control signal for controlling an internal voltage to be generated based on the pre-power-up signal and the power-up signal; and a second control unit suitable for generating a second control signal for controlling an operation of an internal circuit using the internal voltage based on the pre-power-up signal and the post-power-up signal.

In accordance with another embodiment of the present invention, a method of driving a semiconductor device may include starting a generation of an internal voltage, which is generated by using an external power supply voltage, at first power-up timing of the external power supply voltage, and starting an e-fuse array read operation, which is performed by using the internal voltage, at second power-up timing that is later than the first power-up timing by a predetermined time.

In accordance with another embodiment of the present invention, a semiconductor device includes a control signal generator suitable for generating a first control signal, which is activated at first power-up timing of an external power supply voltage, and a second control signal activated at second power-up timing that is later than the first power-up timing by a predetermined time, an internal voltage generator suitable for generating an internal voltage for an e-fuse array read operation by using an external power supply voltage, and an e-fuse array suitable for outputting programmed data when the e-fuse array read operation is performed by using the internal voltage.

The internal circuit, which uses the internal voltage based on the power-up signals sequentially activated when the external power supply voltage is powered up, is controlled to be enabled when the internal voltage is stabilized, so that it may be possible to improve the operational reliability of the internal circuit.

DETAILED DESCRIPTION

Figure 1:
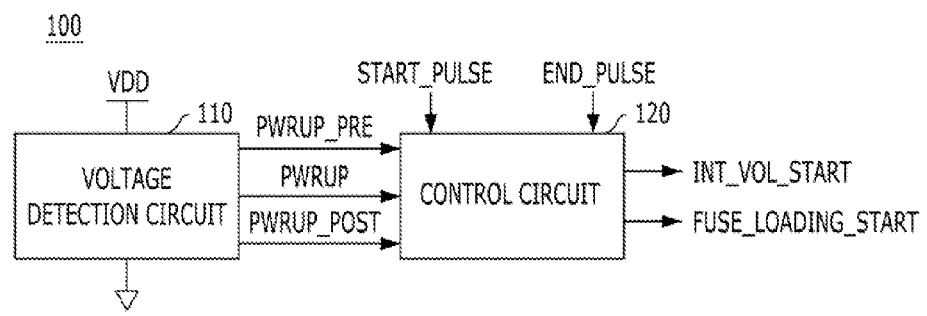
FIG. 1 is a block diagram illustrating a semiconductor device in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like parts in the various figures and embodiments of the present invention. It is also noted that in this specification, "connected/coupled" refers to one component not only directly coupling another component but also indirectly coupling another component; through an intermediate component. In addition, a singular form may include a plural form as long as it is not specifically mentioned in a sentence.

FIG. 1 is a block diagram illustrating a semiconductor device in accordance with an embodiment of the present invention.

Referring to FIG. 1, a semiconductor device 100 includes a voltage detection circuit 110 and a control circuit 120. The voltage detection circuit 110 may detect an external power supply voltage VDD, and sequentially activate first to third power-up signals PWRUP_PRE, PWRUP, and PWRUP_POST in a power-up period of the external power supply voltage VDD. The control circuit 120 may activate a first control signal INT_VOL_START for controlling an internal voltage to be generated based on the first to third power-up signals PWRUP_PRE, PWRUP, and PWRUP_POST, a start pulse START_PULSE, and an end pulse END_PULSE, and to activate a second control signal FUSE_LOADING_START for controlling an operation of an internal circuit using the internal voltage.

The first to third power-up signals PWRUP_PRE, PWRUP, and PWRUP_POST are sequentially activated while substantially maintaining a time difference in the power-up period of the external power supply voltage VDD. In other words, the first and third power-up signals PWRUP_PRE and PWRUP_POST are activated while substantially maintaining a time difference before and after the time point at which the second power-up signal PWRUP is activated. For the purpose of convenience, the first power-up signal PWRUP_PRE is called a pre-power-up signal, the second power-up signal PWRUP is called a power-up signal, and the third power-up signal PWRUP_POST is called a post-power-up signal. In another exemplary embodiment, depending on the design of the semiconductor device, PWRUP_PRE may not be required.

Figure 2:
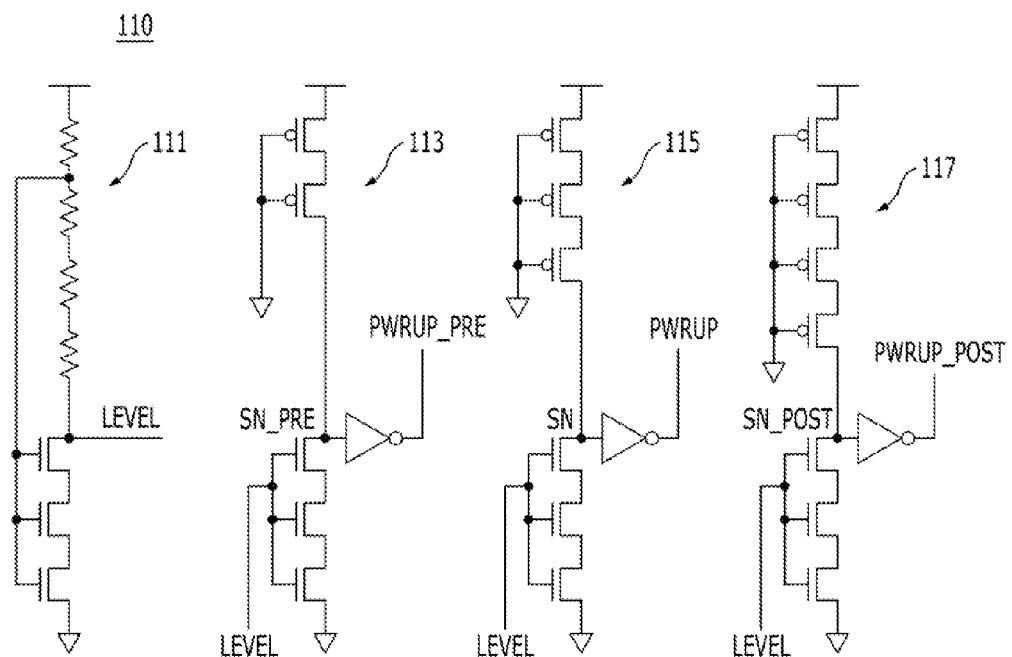
FIG. 2 is a detailed diagram illustrating a voltage detection circuit illustrated in FIG. 1.

FIG. 2 illustrates a detailed diagram illustrating the voltage detection circuit 110.

Referring to FIG. 2, the voltage detection circuit 110 includes a bias unit 111, a first voltage detection unit 113, a second voltage detection unit 115, and a third voltage detection unit 117. The bias unit 111 may activate a bias signal LEVEL when the external power supply voltage VDD is powered up. The first voltage detection unit 113 may activate the pre-power-up signal PWRUP_PRE based on the bias signal LEVEL when the external power supply voltage VDD is at a first target voltage level in the power-up period of the external power supply voltage VDD. The second voltage detection unit 115 may activate the power-up signal PWRUP based on the bias signal LEVEL when the external power supply voltage VDD is at a second target voltage level higher than the first target voltage level in the power-up period of the external power supply voltage VDD. The third voltage detection unit 117 may activate the post-power-up signal PWRUP_POST based on the bias signal LEVEL when the external power supply voltage VDD is at a third target voltage level higher than the second target voltage level in the power-up period of the external power supply voltage VDD.

The bias unit 111 includes four resistors, which are serially connected between an external power supply voltage VDD terminal and an output terminal of the bias signal LEVEL, and three NMOS transistors that receive a voltage divided by the four resistors as gate input and have drains and sources serially connected between the output terminal of the bias signal LEVEL and a ground voltage VSS terminal.

The first to third voltage detection units 113, 115, and 117 may be designed to detect the external power supply voltage VDD by using a voltage division scheme. However, different division ratios should be applied to the first to third voltage detection units 113, 115, and 117. The first voltage detection unit 113 includes two PMOS transistors, which have gates connected to the ground voltage VSS terminal and sources and drains serially connected between the external power supply voltage VDD terminal and a first detection node SN_PRE, and three NMOS transistors that receive the bias signal LEVEL as gate input and have drains and sources serially connected between the first detection node SN_PRE and the ground voltage VSS terminal. The second voltage detection unit 115 includes three PMOS transistors, which have gates connected to the ground voltage VSS terminal and sources and drains serially connected between the external power supply voltage VDD terminal and a second detection node SN, and three NMOS transistors that receive the bias signal LEVEL as gate input and have drains and sources serially connected between the second detection node SN and the ground voltage VSS terminal. The third voltage detection unit 117 includes four PMOS transistors, which have gates connected to the ground voltage VSS terminal and sources and drains serially connected between the external power supply voltage VDD terminal and a third detection node SN_POST, and three NMOS transistors that receive the bias signal LEVEL as gate input and have drains and sources serially connected between the third detection node SN_POST and the ground voltage VSS terminal.

The number and configuration scheme of the elements included in the bias unit 111 and the first to third voltage detection units 113, 115, and 117 are not limited to those illustrated in FIG. 2. For example, various modifications may be made according to design.

Figure 3:
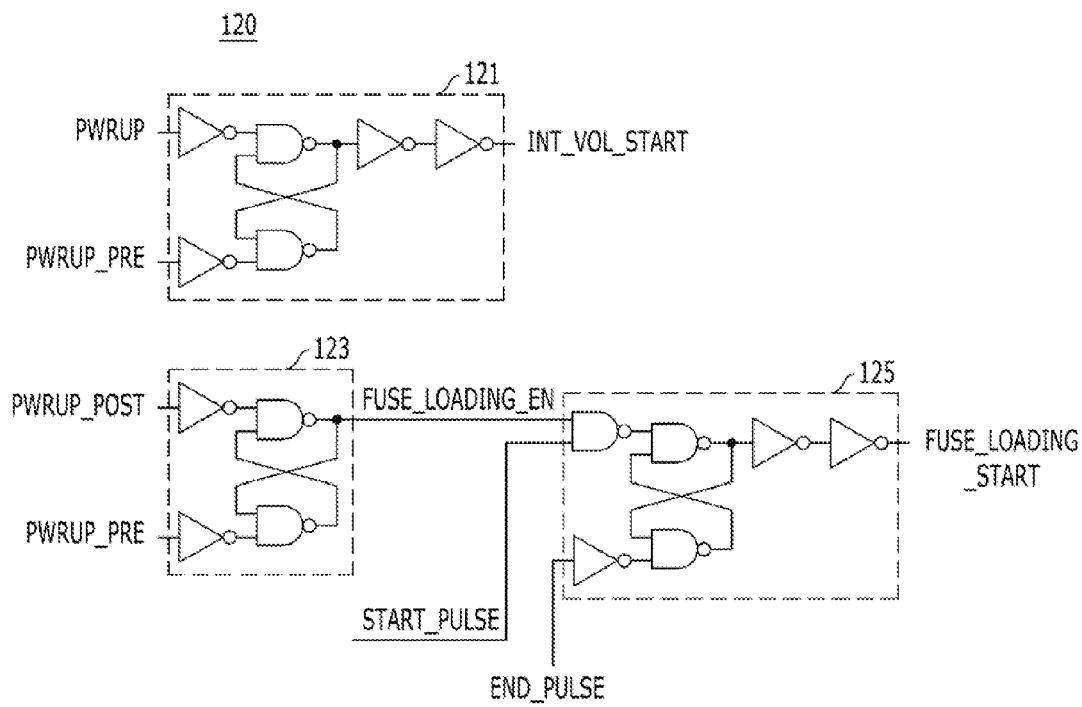
FIG. 3 is a detailed diagram illustrating a control circuit illustrated in FIG. 1.

FIG. 3 illustrates a detailed diagram illustrating the control circuit 120.

Referring to FIG. 3, the control circuit 120 includes a first control unit 121, a second control unit 123, and a third control unit 125. The first control unit 121 may initialize the first control signal INT_VOL_START to a deactivated level based on the pre-power-up signal PWRUP_PRE and may activate the first control signal INT_VOL_START based on the power-up signal PWRUP. The second control unit 123 may initialize a third control signal FUSE_LOADING_EN to a deactivated level based on the pre-power-up signal PWRUP_PRE and may activate the third control signal FUSE_LOADING_EN based on the post-power-up signal PWRUP_POST. The third control unit 125 may activate the second control signal FUSE_LOADING_START for a predetermined period based on the third control signal FUSE_LOADING_EN, the start pulse START_PULSE, and the end pulse END_PULSE.

The first to third control units 121, 123, and 125 may include an RS flip-flop for latching the respective output signals INT_VOL_START, FUSE_LOADING_EN, and FUSE_LOADING_START.

Hereinafter, a description will be provided for an operation of the semiconductor device 100 configured above in accordance with the embodiment of the present invention.

Figure 4:
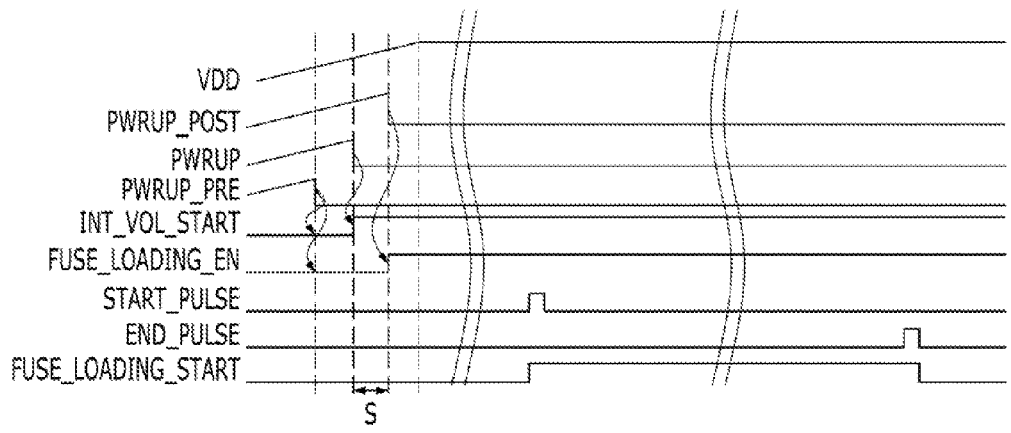
FIG. 4 is a timing diagram illustrating an operation of a semiconductor device in accordance with an embodiment of the present invention.

FIG. 4 is a timing diagram illustrating the operation of the semiconductor device 100 in accordance with the embodiment of the present invention.

Referring to FIG. 4, when the external power supply voltage VDD is supplied from an external source the voltage detection circuit 110 detects the external power supply voltage VDD, and sequentially activates the first to third power-up signals PWRUP_PRE, PWRUP, and PWRUP_POST in the power-up period of the external power supply voltage VDD. In more detail, the bias unit 111 activates the bias signal LEVEL to a logic high level as the external power supply voltage VDD is powered up, the first voltage detection unit 113 activates the pre-power-up signal PWRUP_PRE based on the bias signal LEVEL when the external power supply voltage VDD is at the first target voltage level in the power-up period of the external power supply voltage VDD. The second voltage detection unit 115 activates the power-up signal PWRUP based on the bias signal LEVEL when the external power supply voltage VDD is at the second target voltage level higher than the first target voltage level in the power-up period of the external power supply voltage VDD. The third voltage detection unit 117 activates the post-power-up signal PWRUP_POST based on the bias signal LEVEL when the external power supply voltage VDD is at the third target voltage level higher than the second target voltage level in the power-up period of the external power supply voltage VDD.

Then, the control circuit 120 activates the first control signal INT_VOL_START for controlling the internal voltage to be generated based on the pre-power-up signal PWRUP_PRE, the power-up signal PWRUP, the post-power-up signal PWRUP_POST, the start pulse START_PULSE, and the end pulse END_PULSE, and activates the second control signal FUSE_LOADING_START for controlling the operation of the internal circuit using the internal voltage after a predetermined time S. In more detail, in the state in which the first control unit 121 and the second control unit 123 initialize the first and third control signals INT_VOL_START and FUSE_LOADING_EN to a deactivation level based on the pre-power-up signal PWRUP_PRE the first control unit 121 activates the first control signal INT_VOL_START based on the power-up signal PWRUP, and then the second control unit 123 activates the third control signal FUSE_LOADING_EN based on the post-power-up signal PWRUP_POST.

The predetermined time 'S' is set such that a time for stably generating the internal voltage is ensured. Accordingly, the third control signal FUSE_LOADING_EN indicates that the internal voltage is stably generated.

In the state in which the third control signal FUSE_LOADING_EN is activated, when the start pulse START_PULSE is activated, the third control unit 125 activates the second control signal FUSE_LOADING_START for the predetermined period until the end control pulse END_PULSE is activated. The second control signal FUSE_LOADING_START may be used to control the operation of the internal circuit using the internal voltage, wherein an activation period of the second control signal FUSE_LOADING_START is determined by the start pulse START_PULSE and the end pulse END_PULSE. When the second control signal FUSE_LOADING_START is activated the internal circuit loads a fuse signal corresponding to a fuse state to be latched.

In accordance with the embodiment of the present invention as described above, the operation of the internal circuit may be performed when the internal voltage is stabilized.

Figure 5:
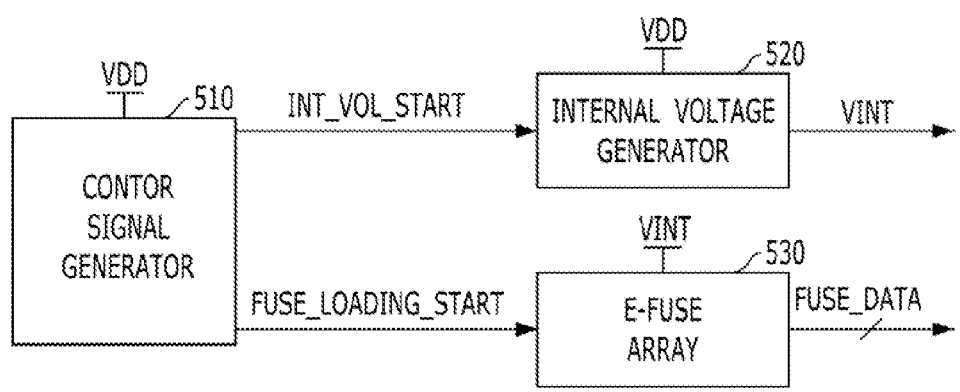
FIG. 5 is a block diagram illustrating a semiconductor device in accordance with another embodiment of the present invention.

FIG. 5 is a block diagram illustrating a semiconductor device in accordance with another embodiment of the present invention.

Referring to FIG. 5, a semiconductor device includes a control signal generator 510, an internal voltage generator 520, and an e-fuse array 530.

The control signal generator 510 may generate a first control signal INT_VOL_START and a second control signal FUSE_LOADING_START. The control signal generator 510 may include the voltage detection circuit 110 and the control circuit 120 shown in FIG. 1. Furthermore, the first control signal INT_VOL_START and the second control signal FUSE_LOADING_START may have substantially the same wave form as illustrated in FIG. 4. Meanwhile, the activation time point of the second control signal FUSE_LOADING_START may be controlled by the activation time point of the third control signal FUSE_LOADING_EN.

The internal voltage generator 520 may generate an internal voltage VINT for an e-fuse array read operation based on the first control signal INT_VOL_START.

The e-fuse array 530 may output fuse data FUSE_DATA, which are programmed therein, when the e-fuse array read operation is performed using the internal voltage VINT, in the power-up sequence.

In accordance with the embodiment of the present invention, in the power-up sequence, the read operation of the e-fuse array 530 may be performed when the internal voltage VINT is stabilized, so that the fuse data FUSE_DATA may be obtained normally.

While the present invention has been described with respect to the specific embodiments, it will be apparent to those skilled in the art that various changes and modifications may be made without departing from the spirit and scope of the invention as defined in the following claims.

For example, the embodiment of the present invention has described an example in which one first control signal and one second control signal are generated. However, the present invention is not limited thereto. For example, a plurality of first control signals and a plurality of second control signals may be generated according to design (for individually controlling a plurality of internal circuits). At this time, the plurality of first control signals and the plurality of second control signals may be designed to be simultaneously or sequentially activated.

Furthermore, the embodiment of the present invention has described an example in which the second control signal enables the internal circuit. However, the present invention is not limited thereto. For example, the third control signal may be designed to control the enabling of the internal circuit.

What is claimed is:

1. A semiconductor device comprising:
a voltage detection circuit suitable for detecting an external power supply voltage and for sequentially activating a first power-up signal and a second power-up signal in a power-up period of the external power supply voltage; and
a control circuit suitable for activating at least one first control signal for controlling an internal voltage to be generated based on the first power-up signal, and for activating at least one second control signal for controlling an operation of an internal circuit using the internal voltage when a predetermined time lapses after the first control signal is activated, based on the second power-up signal,
wherein the voltage detection circuit activates the first power-up signal when the external power supply voltage is at a first target voltage level and activates the second power-up signal when the external power supply voltage is at a second target voltage level that is higher than the first target voltage level.

2. The semiconductor device of claim 1, wherein the predetermined time includes a time required until the internal voltage reaches a target voltage level.

3. The semiconductor device of claim 1, wherein when two or more first control signals are generated, the two or more first control signals are sequentially activated.

4. The semiconductor device of claim 1, wherein, when two or more second control signals are generated, the two or more second control signals are sequentially activated.

5. The semiconductor device of claim 1, wherein the internal circuit includes a circuit for controlling a fuse signal corresponding to a fuse state to be latched.

6. A semiconductor device comprising:
a voltage detection circuit suitable for activating a pre-power-up signal when an external power supply voltage is at a first target voltage level in a power-up period of the external power supply voltage, for activating a power-up signal when the external power supply voltage is at a second target voltage level that is higher than the first target voltage level in the power-up period of the external power supply voltage, and for activating a post-power-up signal when the external power supply voltage is at a third target voltage level that is higher than the second target voltage level in the power-up period of the external power supply voltage;
a first control unit suitable for generating a first control signal for controlling an internal voltage to be generated based on the pre-power-up signal and the power-up signal; and
a second control unit suitable for generating a second control signal for controlling an operation of an internal circuit using the internal voltage based on the pre-power-up signal and the post-power-up signal.

7. The semiconductor device of claim 6, wherein the internal circuit includes a circuit for controlling a fuse signal corresponding to a fuse state to be latched.

8. The semiconductor device of claim 6, further comprising:
a third control unit suitable for generating a third control signal for enabling an operation of the internal circuit using the internal voltage for a predetermined period based on the second control signal, a start pulse, and an end pulse.

9. The semiconductor device of claim 8, wherein the first to third control units include a latch section, respectively.

10. The semiconductor device of claim 6, wherein the voltage detection circuit comprising:
a bias unit suitable for activating a bias signal when the external power supply voltage is powered up;
a first voltage detection unit suitable for activating the pre-power-up signal based on the bias signal when the external power supply voltage is at the first target voltage level in the power-up period of the external power supply voltage;
a second voltage detection unit suitable for activating the power-up signal based on the bias signal when the external power supply voltage is at the second target voltage level that is higher than the first target voltage level in the power-up period of the external power supply voltage; and
a third voltage detection unit suitable for activating the post-power-up signal based on the bias signal when the external power supply voltage is at the third target voltage level that is higher than the second target voltage level in the power-up period of the external power supply voltage.

11. The semiconductor device of claim 10, wherein each of the first to third voltage detection units is suitable for detecting the external power supply voltage using a voltage division scheme.

12. A semiconductor device comprising:
a control signal generator suitable for generating a first control signal, which is activated at first power-up timing of an external power supply voltage, and a second control signal activated at second power-up timing that is later than the first power-up timing by a predetermined time;
an internal voltage generator suitable for generating an internal voltage for an e-fuse array read operation by using an external power supply voltage; and
an e-fuse array suitable for outputting programmed data when the e-fuse array read operation is performed by using the internal voltage,
wherein the control signal generator includes a voltage detection circuit suitable for detecting the external power supply voltage to sequentially activate a first power-up signal and a second power-up signal in a power-up period of the external power supply voltage, the voltage detection circuit activates the first power-up signal when the external power supply voltage is at a first target voltage level and activates the second power-up signal when the external power supply voltage is at a second target voltage level that is higher than the first target voltage level.

13. The semiconductor device of claim 12, wherein the control signal generator comprises:
a control circuit suitable for generating the first control signal based on the first power-up signal, and generating the second control signal based on the second power-up signal.

* * * * *